(12) United States Patent
Tu et al.

(10) Patent No.: US 6,797,534 B1
(45) Date of Patent: Sep. 28, 2004

(54) METHOD OF INTEGRATING THE FABRICATION PROCESS FOR INTEGRATED CIRCUITS AND MEM DEVICES

(75) Inventors: Shuo-Lin Tu, Hsinchu (TW); Lu-Shan Chiang, Hsinchu (TW); Shih-Lin Chu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/418,121

(22) Filed: Apr. 18, 2003

(51) Int. Cl.[7] .................................. H01L 21/00
(52) U.S. Cl. ..................... 438/48; 438/50; 438/637
(58) Field of Search ............... 439/48–54, 618–640

(56) References Cited

U.S. PATENT DOCUMENTS

2003/0186480 A1 * 10/2003 Okumura et al. ............. 438/48

\* cited by examiner

*Primary Examiner*—H. Jey Tsai
(74) *Attorney, Agent, or Firm*—Finnegan, Henderson, Farabow, Garrett & Dunner, L.L.P.

(57) ABSTRACT

A method of forming a MEM device with an integrated circuit that includes providing a semiconductor substrate including a first region and a second region, forming an integrated circuit device on the first region, forming a first insulating layer on the semiconductor substrate, etching the first insulating layer to form a first dielectric layer on the first region and a second dielectric layer on the second region spaced apart from the first dielectric layer, forming a second insulating layer over the semiconductor substrate, the first dielectric layer and the second dielectric layer, etching the second insulating layer to expose the first dielectric layer, forming a third insulating layer over the semiconductor substrate, the second insulatng layer and the first dielectric layer, etching the third insulating layer to form a plurality of vias, and forming a metal layer over the semiconductor substrate to fill the vias.

18 Claims, 3 Drawing Sheets

METHOD OF INTEGRATING THE FABRICATION PROCESS FOR INTEGRATED CIRCUITS AND MEM DEVICES

DESCRIPTION OF THE INVENTION

1. Field of the Invention

This invention pertains in general to a fabrication process of a micro-electromechanical ("MEM") device. More particularly, this invention relates to methods of integrating the fabrication processes of MEM devices and integrated circuits.

2. Background of the Invention

MEM devices have many known applications in microactuators and microsensors. A fabrication process that combines those of MEM devices and microelectronic circuits in a modular fashion is advantageous from the perspective of system performance and cost. To make the fabrication of MEM devices compatible with a typical complementary metal-oxide-semiconductor ("CMOS") process, however, conventional techniques require separate processes for fabricating MEM devices and integrated circuits. For example, integrated circuits are usually fabricated prior to starting the MEM fabrication process. Such a fabrication strategy is disadvantageous in that some processing steps common to the integrated circuits and MEM devices, including, for instance, depositing dielectric layers, etching via holes and forming metal layers, are repeatedly performed in separate processes, resulting in an increase in fabrication cost.

SUMMARY OF THE INVENTION

Accordingly, the present invention is directed to a fabrication process that obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the circuit structures particularly pointed out in the written description and claims thereof, as well as the appended drawings.

To achieve these and other advantages, and in accordance with the purpose of the invention as embodied and broadly described, there is provided a method of forming a MEM device with an integrated circuit that includes providing a semiconductor substrate including a first region and a second region, forming an integrated circuit device on the first region, forming a first insulating layer on the semiconductor substrate, etching the first insulating layer to form a first dielectric layer on the first region and a second dielectric layer on the second region spaced apart from the first dielectric layer, forming a second insulating layer over the semiconductor substrate, the first dielectric layer and the second dielectric layer, etching the second insulating layer to expose the first dielectric layer, forming a third insulating layer over the semiconductor substrate, the second insulating layer and the first dielectric layer, etching the third insulating layer to form a plurality of vias, and forming a metal layer over the semiconductor substrate to fill the vias.

In one aspect, the first insulating layer is composed of borophosphosilicate glass.

In another aspect, the first insulating layer has a thickness in the range of approximately 6500~11000 Å.

Also in accordance with the present invention, there is provided a method of integrating a fabrication process of a MEM device with a fabrication process of an integrated circuit that includes forming an integrated circuit device on a semiconductor substrate, forming a borophosphosilicate glass layer on the semiconductor substrate, etching the borophosphosilicate glass layer to form a first dielectric layer over a first region in the semiconductor substrate and a second dielectric layer on a second region in the semiconductor substrate, wherein the second dielectric layer is spaced apart from the first dielectric layer, forming a first insulating layer over the semiconductor substrate, the first dielectric layer and the second dielectric layer, forming a conductive film on the first insulating layer, etching the first insulating layer and the conductive film to expose the first dielectric layer, forming a second insulating layer over the semiconductor substrate, the first insulating layer and the first dielectric layer, etching the second insulating layer to form a plurality of vias, and forming a metal layer over the semiconductor substrate to fill the vias.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1A:
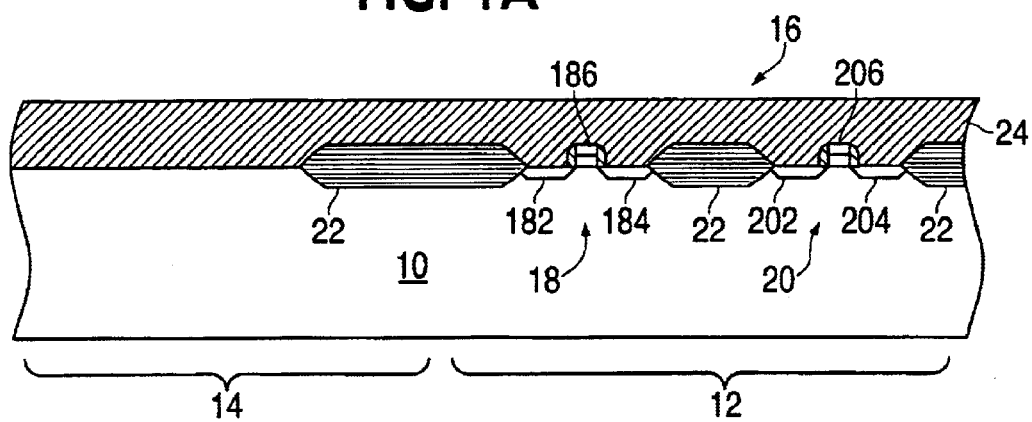
FIGS. 1A to 1E are cross-sectional views illustrating a fabrication process in accordance with one embodiment of the present invention.

The present invention provides a method of integrating the fabrication processes common to MEM devices and integrated circuits. FIGS. 1A to 1E are cross-sectional views of a fabrication process in accordance with one embodiment of the present invention. Referring to FIG. 1A, the method of the invention begins with providing a semiconductor substrate 10, for example, a silicon substrate or a gallium arsenide ("GaAs") substrate. Semiconductor substrate 10 includes a first region 12 defined for an integrated circuit device and a second region 14 defined for a MEM device.

Next, an integrated circuit 16 is formed on first region 12. Integrated circuit 16 includes CMOS or bipolar CMOS transistors (not shown) which in turn include at least one NMOS transistor 18 and at least one PMOS transistor 20. NMOS transistor 18 Includes n$^+$ diffused regions 182 and 184, a p-type channel (not numbered) formed between n$^+$ diffused regions 182 and 184, and a gate 186. Similarly, PMOS transistor 20 includes p$^+$ diffused regions 202 and 204, an n-type channel (not numbered) formed between p$^+$ diffused regions 202 and 204, and a gate 206. NMOS transistor 18 is electrically isolated from PMOS transistor 20 by an isolation structure 22, for example, a local oxidation of silicon ("LOCOS").

A first insulating layer 24 is formed on semiconductor substrate 10. In one embodiment, first insulating layer 24 is composed of phosphosilicate glass ("PSG") or borophosphosilicate glass ("BPSG"). In one embodiment, first insulating layer 24 has a thickness greater than approximately 6500 Å. In another embodiment, first insulating layer 24 has a thickness smaller than approximately 11000 Å. A rapid thermal process ("RTP") may then be performed to anneal first insulating layer 24.

Figure 1B:
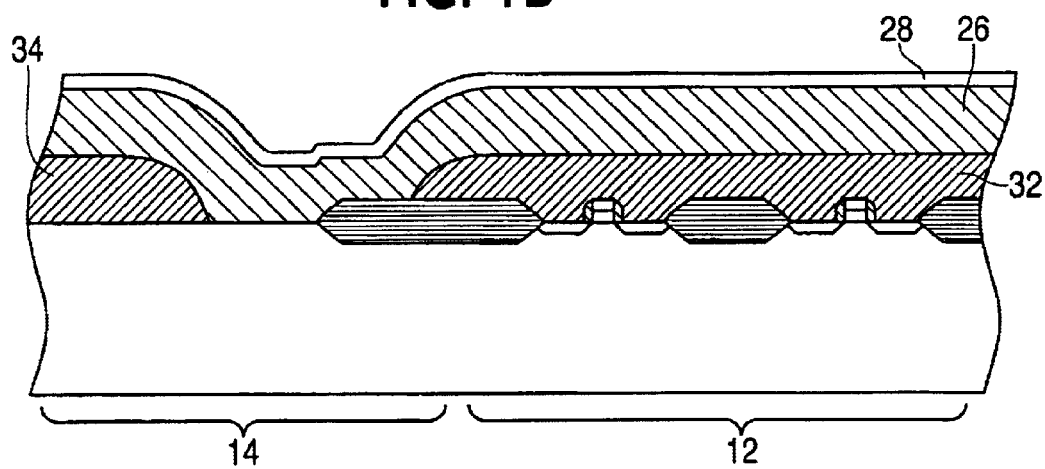

Referring to FIG. 1B, using conventional lithography and etching processes, first insulating layer 24 is etched to form a first dielectric layer 32 on first region 12, and a second dielectric layer 34 on second region 14. Second dielectric layer 34 is spaced apart from first dielectric layer 32, and serves as a sacrificial layer for a MEM device to be fabricated on second region 14.

Subsequently, a second insulating layer 26, which serves as a structural layer for the MEM device, is formed over semiconductor substrate 10 and dielectric layers 32, 34. In one embodiment, second insulating layer 26 is composed of silicon nitride, for example, $Si_3N_4$. In another embodiment, second insulating layer 26 has a thickness of approximately 10000 Å.

Next, a conductive film 28 may be formed on second insulating layer 26. Conductive film 28 serves as a heater for the MEM device. In one embodiment, conductive film 28 has a thickness greater than approximately 3000 Å. In another embodiment, conductive film 28 has a thickness smaller than approximately 6500 Å.

Figure 1C:
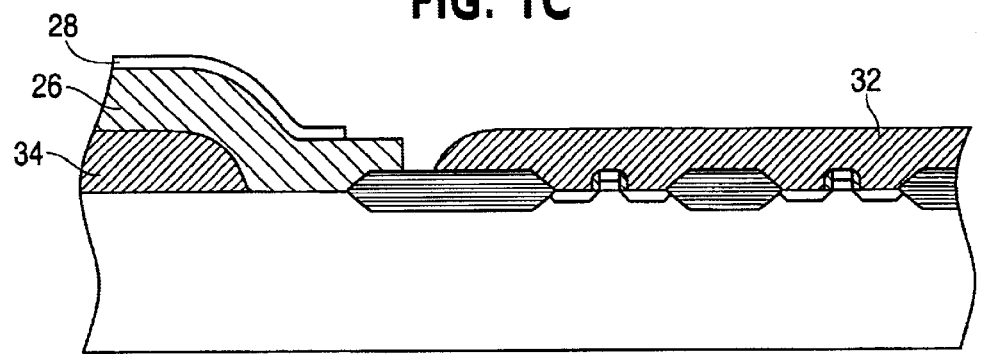

Referring to FIG. 1C, second insulating layer 26 and conductive film 28 are etched using conventional processes to expose first dielectric layer 32.

Figure 1D:
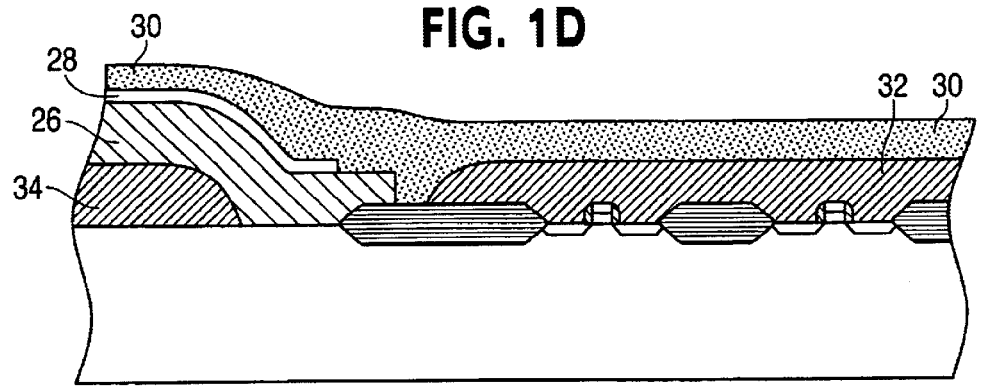

Referring to FIG. 1D, a third insulating layer 30 is formed over the semiconductor structure using a plasma enhanced chemical vapor deposition ("PECVD") process. Third insulating layer 30 serves as a dielectric layer for interconnect metal layers. In one embodiment, third insulating layer 30 is composed of silicon oxide, specifically, silicon dioxide.

Figure 1E:
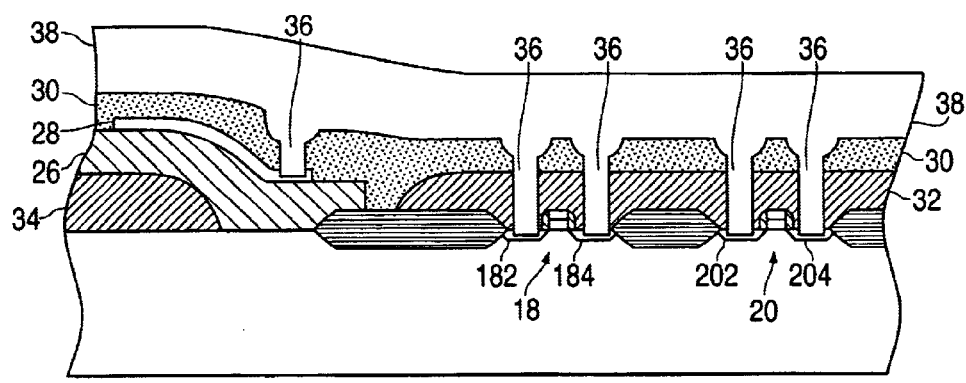

Referring to FIG. 1E, third insulating layer 30 and first dielectric layer 32 are etched using conventional processes to form a plurality of vias 36, which expose diffused regions 182 and 184 of NMOS transistor 18, diffused regions 202 and 204 of PMOS transistor 20 in first region 12, and conductive film 28 in second region 14. A metal layer 38, for example, AlCu, is provided to fill vias 36. Metal layer 38 present in vias 36 serves to electrically connect diffused regions 182 and 184 of NMOS transistor 18, and diffused regions 202 and 204 of PMOS transistor 20 to act as contact regions for integrated circuit 16, and metal layer 38 present in vias 36 serves to electrically connect conductive film 28 to act as a contact region for the. MEM device. Metal layer 38 is then etched using conventional processes to form conductive transmission lines.

Figure 2:
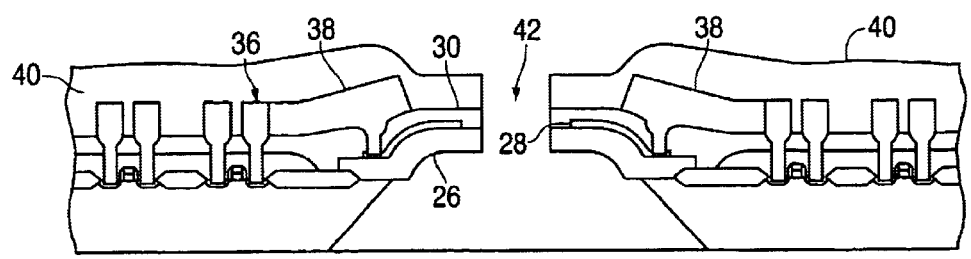
FIG. 2 shows a cross-sectional view of a MEM device fabricated in accordance with one embodiment of the present invention.

Referring to FIG. 2, a protection layer 40 of, for example, glass, is formed over semiconductor substrate 10. A MEM nozzle 42 is then formed by conventional techniques. An example of the conventional technique includes U.S. Pat. No. 6,213,589 to Silverbrook, entitled "Planar Thermoelastic Bend Actuator Ink Jet Printing Mechanism," and is herein incorporated by reference. Next, a portion of second dielectric layer 34 is removed using conventional lithography and etching processes to release the MEM device. In one embodiment, second dielectric layer 34 is entirely removed.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a MEM device with an integrated circuit, comprising:
    providing a semiconductor substrate including a first region and a second region;
    forming an integrated circuit device on the first region;
    forming a first insulating layer on the semiconductor substrate;
    etching the first insulating layer to form a first dielectric layer on the first region and a second dielectric layer on the second region spaced apart from the first dielectric layer;
    forming a second insulating layer over the semiconductor substrate, the first dielectric layer and the second dielectric layer;
    etching the second insulating layer to expose the first dielectric layer;
    forming a third insulating layer over the semiconductor substrate, the second insulating layer and the first dielectric layer;
    etching the third insulating layer to form a plurality of vias; and
    forming a metal layer over the semiconductor substrate to fill the vias.

2. The method of claim 1, further comprising forming the first insulating layer with borophosphosilicate glass.

3. The method of claim 1, further comprising annealing the first insulating layer by using a rapid thermal process.

4. The method of claim 1, further comprising forming the first insulating layer having a thickness in the range of approximately 6500~11000 Å.

5. The method of claim 1, further comprising forming a conductive film on the second insulating layer after forming a second insulating layer over the semiconductor substrate, the first dielectric layer and the second dielectric layer.

6. The method of claim 1, further comprising forming the second insulating layer with silicon nitride.

7. The method of claim 6, further comprising forming the second insulating layer having a thickness of approximately 10000 Å.

8. The method of claim 1, further comprising forming the third insulating layer with silicon oxide.

9. The method of claim 1, further comprising forming the integrated circuit with at least one NMOS transistor and at least one PMOS transistor.

10. The method of claim 1, further comprising removing a portion of the second dielectric layer.

11. A method of integrating a fabrication process of a MEM device with a fabrication process of an integrated circuit, comprising:
    forming an integrated circuit device on a semiconductor substrate;
    forming a borophosphosilicate glass layer on the semiconductor substrate;
    etching the borophosphosilicate glass layer to form a first dielectric layer over a first region in the semiconductor substrate and a second dielectric layer on a second region in the semiconductor substrate, wherein the second dielectric layer is spaced apart from the first dielectric layer;

forming a first insulating layer over the semiconductor substrate, the first dielectric layer and the second dielectric layer;

forming a conductive film on the first insulating layer;

etching the first insulating layer and the conductive film to expose the first dielectric layer;

forming a second insulating layer over the semiconductor substrate, the first insulating layer and the first dielectric layer;

etching the second insulating layer to form a plurality of vias; and forming a metal layer over the semiconductor substrate to fill the vias.

12. The method of claim 11, further comprising annealing the borophosphosilicate glass layer by using a rapid thermal process.

13. The method of claim 11, further comprising forming the borophosphosilicate glass layer having a thickness in the range of approximately 6500~11000 Å.

14. The method of claim 11, further comprising forming the first insulating layer with silicon nitride.

15. The method of claim 14, further comprising forming the first insulating layer having a thickness of approximately 10000 Å.

16. The method of claim 11, further comprising forming the second insulating layer with silicon oxide.

17. The method of claim 11, further comprising forming the integrated circuit with at least one NMOS transistor and at least one PMOS transistor.

18. The method of claim 11, further comprising removing a portion of the second dielectric layer.

* * * * *